(12) United States Patent
Yuasa et al.

(10) Patent No.: US 9,905,521 B2
(45) Date of Patent: Feb. 27, 2018

(54) METHOD FOR MANUFACTURING SEMICONDUCTOR LIGHT-EMITTING DEVICE AND SEMICONDUCTOR LIGHT-EMITTING DEVICE

(71) Applicant: Stanley Electric Co., Ltd., Tokyo (JP)

(72) Inventors: Mamoru Yuasa, Tokyo (JP); Toshifumi Watanabe, Tokyo (JP); Kaori Tachibana, Tokyo (JP); Kazuyoshi Taniguchi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/157,133

(22) Filed: May 17, 2016

(65) Prior Publication Data

US 2016/0343927 A1 Nov. 24, 2016

(30) Foreign Application Priority Data

May 18, 2015 (JP) .................................. 2015-100707

(51) Int. Cl.
*H01L 33/00* (2010.01)
*H01L 23/00* (2006.01)
(Continued)

(52) U.S. Cl.
CPC ............ *H01L 24/05* (2013.01); *H01L 25/167* (2013.01); *H01L 33/486* (2013.01); *H01L 2224/08502* (2013.01); *H01L 2933/0033* (2013.01)

(58) Field of Classification Search
CPC . H01L 2924/12041; H01L 2224/48247; H01L 2224/48257; H01L 33/486; H01L 33/62; H01L 2924/12035
See application file for complete search history.

(56) References Cited

U.S. PATENT DOCUMENTS

2009/0001404 A1* 1/2009 Ohata ................... H01L 33/486
257/99
2011/0127566 A1* 6/2011 Yoon ..................... H01L 33/486
257/99
(Continued)

FOREIGN PATENT DOCUMENTS

JP 2006-269079 A 10/2006
JP 2012-165016 A 8/2012

*Primary Examiner* — Allen Parker
*Assistant Examiner* — Frederick B Hargrove
(74) *Attorney, Agent, or Firm* — Kenealy Vaidya LLP

(57) ABSTRACT

Methods for manufacturing semiconductor light-emitting devices and semiconductor light-emitting devices having a high radiating performance and can include a metallic laminate substrate, a semiconductor light-emitting chip and a transparent resin. The metallic laminate substrate can include a cavity so as to be able to accurately mount the light-emitting chip, and also can structures to efficiently radiate heat generated from the light-emitting chip. The transparent resin to encapsulate the semiconductor light-emitting chip in the cavity can include various wavelength converting materials. Additionally, the light-emitting devices can be manufactured in manufacturing processes similar to conventional light-emitting devices. Thus, the disclosed subject matter can provide semiconductor light-emitting devices having a high radiating performance and a high alignment accuracy, which can emit various color lights including a substantially white color tone, and therefore can be used as a light source for lighting units such as a vehicle headlight, general light, a stage lighting, etc.

12 Claims, 11 Drawing Sheets

(51) Int. Cl.
*H01L 25/16* (2006.01)
*H01L 33/48* (2010.01)

(56) References Cited

U.S. PATENT DOCUMENTS

2014/0145216 A1* 5/2014 Chen .................. H01L 24/06
257/88
2014/0167078 A1* 6/2014 Jang .................. H01L 33/62
257/88

* cited by examiner

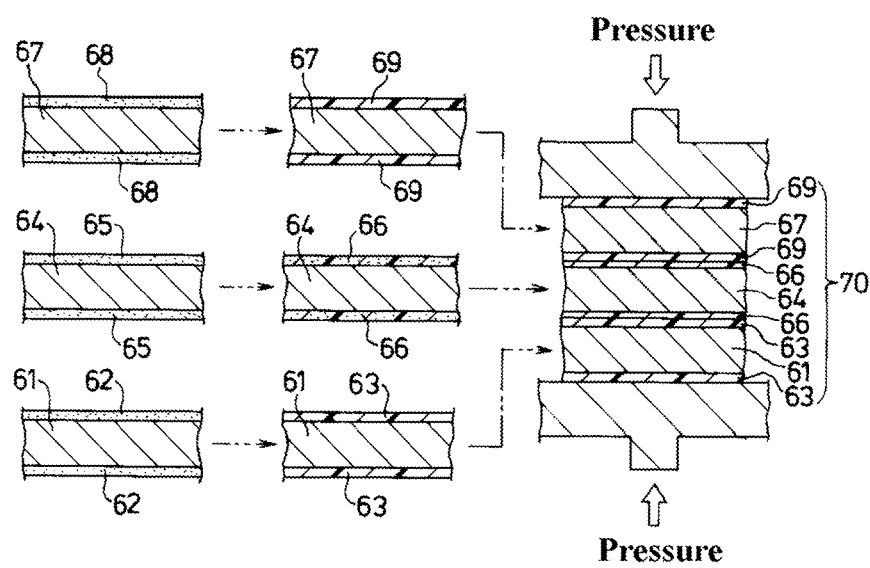

FIG. 8

|  | Cycle numbers | | | | |
| --- | --- | --- | --- | --- | --- |
|  | 0 | 500 | 1000 | 2000 | 3000 |
| Tension strength(kgf) / Shear strength (MPa) | 187/10.2 | 215/11.7 | 132/7.2 | 97/5.3 | 91/5.0 |
|  | 194/10.6 | 106/5.8 | 104/5.7 | 87/4.7 | 88/4.8 |
|  | 241/13.1 | 196/10.7 | 127/6.9 | 101/5.5 | 88/4.8 |
| Average | 207/11.3 | 172/9.4 | 121/6.6 | 95/5.1 | 89/4.8 | and a pair of lead electrodes 84 made from a
METHOD FOR MANUFACTURING SEMICONDUCTOR LIGHT-EMITTING DEVICE AND SEMICONDUCTOR LIGHT-EMITTING DEVICE This application claims the priority benefit under 35 U.S.C. § 119 of Japanese Patent Application No. 2015-100707 filed on May 18, 2015, which is hereby incorporated in its entirety by reference.

BACKGROUND

1. Field

The presently disclosed subject matter relates to methods for manufacturing semiconductor light-emitting devices and semiconductor light-emitting devices, and more particularly to the methods for manufacturing the semiconductor light-emitting devices that can provide a high radiating performance and a high alignment accuracy and the semiconductor light-emitting devices having a high radiating performance and a high alignment accuracy which can be used as a light source for lighting units such as a vehicle lamp, etc.

2. Description of the Related Art

Recently, vehicle lamps such a headlight using a semiconductor light-emitting device as a light source have been put to practical use, and therefore have been required for semiconductor light-emitting devices having a high light-intensity. The semiconductor light-emitting devices having a high light-intensity may be accomplished by applying a large current to high-capacity semiconductor light-emitting chips in general. However, when light having a high brightness is emitted by a semiconductor light-emitting device using the large current, because an amount of heat generated from the semiconductor light-emitting device increases, a temperature of the semiconductor light-emitting device may increase due to a self-generated heat of the device.

Accordingly, when the semiconductor light-emitting device is driven by the large current, a light-emitting life may decrease due to a degradation of the semiconductor light-emitting device, which is caused by increasing the temperature of the semiconductor light-emitting device, with decrease in an amount of light emitting because of a decrease of light conversion efficiency, which is caused by increasing the temperature of the semiconductor light-emitting device. As a result, the semiconductor light-emitting device may be difficult to maintain a high reliability and an appropriate amount of the light emitting.

In order for the semiconductor light-emitting device to maintain the high reliability and the appropriate amount of the light emitting, the increase of the temperature due to the self-generated heat of the semiconductor light-emitting device may be required to be prevented by improving a radiating performance of the heat generated from the semiconductor light-emitting device. Thereby, the improvement of the radiating performance may result in a low-power consumption of the semiconductor light-emitting device.

Such a semiconductor light-emitting device is disclosed in Patent document No. 1 (Japanese Patent Application Laid Open JP 2012-165016). FIG. 9 is an explanatory cross-sectional view depicting a first conventional semiconductor light-emitting device, which is disclosed in Patent document No. 1. The first conventional light-emitting device 100 includes: an alumina laminate sheet 82 including a first aluminum sheet 80 and a second aluminum sheet 81; a pair of electrode pads 83 made from a metallic layer, and formed on the second aluminum sheet 81 of the alumina laminate sheet 82; and a pair of lead electrodes 84 made from a metallic layer, formed underneath the first aluminum sheet 80 of the alumina laminate sheet 82, and each of the lead electrodes 84 being electrically connected to a respective one of the electrode pads 83 via a though hole 85 made from a silver (Ag), respectively.

In addition, the first conventional light-emitting device 100 also includes a light-emitting diode (LED) chip 86 having a p-electrode 88 and a n-electrode 89 formed on a light-emitting layer 87, each of the p-electrode 88 and the n-electrode 89 being electrically connected to the respective one of the electrode pads 83 via Au bump 90 and silver paste 91, attached to the alumina laminate sheet 82 using an underfill resin 92, which is disposed between the alumina laminate sheet 82 and a sapphire transparent substrate 93 of the LED chip 86, and thereby light emitted from the light-emitting layer 87 can be emitted via the sapphire substrate 93.

In this case, the pair of electrode pads 83 formed on the second aluminum sheet 81 and the pair of lead electrodes 84 formed underneath the first aluminum sheet 80 in the aluminum laminate substrate 82 may be electrically connected via the though holds 85 including the Ag. Hence, the first conventional light-emitting device 100 may improve a thermal conductivity and a heat resistance thereof.

FIG. 10 is an explanatory cross-sectional view depicting a second conventional semiconductor light-emitting device, which is disclosed in Patent document No. 2 (Japanese Patent Application Laid Open JP 2006-269079). The second conventional semiconductor light-emitting device 110 includes: a red LED chip 111; a green LED chip 112; a blue LED chip 113; a sub mount substrate 114 mounting the red LED chip 111, the green LED chip 112 and the blue LED chip 113 thereon; a wiring board 117 configured to be electrically connected to electrodes of each of the red LED chip 111, the green LED chip 112 and the blue LED chip 113; a metal substrate 116 mounting the sub mount substrate 114 and the wiring board 117 thereon; and a heat sink 115 attached to the metal substrate 116 to radiate heats from generated from each of the red LED chip 111, the green LED chip 112 and the blue LED chip 113.

However, in the first conventional semiconductor light-emitting device 100, the heat generated from the LED chip 86 may radiated in an outer direction of the device 100 by transmitting the heat to each of the p-electrode 88 and the n-electrode 89 of the LED chip 86, the pair of electrode pas 83, the though holes 85 and the pair of lead electrodes 84. The heat must be transmitted to elements having a small cross-sectional area such the Au bump 90 and the though hole 85 in a transmitting pathway between the LED chip 86 and the lead electrodes 84. Accordingly, the first conventional device 100 may be difficult to fully prevent from an increase of temperature caused by a self-generated heat of the LED chip 86, because a thermal resistance in the transmitting pathway may increase and a radiating efficiency may decrease.

In addition, according to the second conventional semiconductor light-emitting device 110, when each of the red LED chip 111, the green LED chip 112 and the blue LED chip 113 is mounted on the sub mount substrate 114, a misalignment of each of the red LED chip 111, the green LED chip 112 and the blue LED chip 113 with respect to the sub mount substrate 114 may occur although alignment means of the LEDs may not be defined. When the sub mount substrate 114 is mounted on the metal substrate 116, a misalignment of the sub mount substrate 114 with respect to the metal substrate 116 may occur due to the similar reason. Therefore, when the conventional semiconductor light-emitting device 110 is used as a light source for vehicle lamps such as a headlight, the vehicle lamps may cause a degradation of light distribution characteristics and the like because of the misalignments.

The above-referenced Patent Documents are listed below, and are hereby incorporated with their English abstracts in their entireties.
1. Patent Document No. 1: Japanese Patent Application Laid Open JP 2012-165016
2. Patent Document No. 2: Japanese Patent Application Laid Open JP 2006-269079

The disclosed subject matter has been devised to consider the above and other problems features and characteristics. Thus, an embodiment of the disclosed subject matter can include a method for manufacturing semiconductor light-emitting devices having a metallic laminate substrate using an electro-painting method that can improve a radiating performance and alignment accuracy by utilizing features of a metallic laminate substrate, while reducing other associated problems of the conventional devices.

SUMMARY

The presently disclosed subject matter has been devised in view of the above and other problems features and characteristics. An aspect of the disclosed subject matter includes methods for manufacturing the semiconductor light-emitting devices having the high radiating performance and the high alignment accuracy, which can be effectively accomplished by using a metallic laminate substrate. Another aspect of the disclosed subject matter provide semiconductor light-emitting devices having a high radiating performance and a high alignment accuracy, which can emit various color lights including a substantially white color tone, and therefore can be used as a light source for various lighting units such as a vehicle headlight, general light, a stage lighting, etc.

According to an aspect of the disclosed subject matter, a method for manufacturing semiconductor light-emitting devices can include: preparing a base plate including a first die bonding contact surface and a second die bonding contact surface, and preparing a laminate plate including a first cavity and a second cavity; forming a first coating layer around the base plate using an electro-painting method, and forming a second coating layer around the laminate plate using the electro-painting method; forming a first resin coating layer around the base plate by solidifying the base plate including the above-described first coating layer using a heating treatment at a first prescribed temperature, and forming a soft second coating layer around the laminate plate by semi-solidifying the laminate plate including the above-described second coating layer using a heating treatment at a first predetermined temperature; forming the metallic laminate substrate, which is completely solidified by overlapping the laminate plate with the base plate in a predetermined position and by pressuring the laminate plate and the base plate from both sides of the laminate plate and the base plate, while carrying out a heating treatment at a second prescribed temperature; exposing a first die bonding contact surface and a second die bonding contact surface from the first resin coating layer by removing the first resin coating layer of the base plate, and exposing each of a first bonding wire contact surface and a second bonding wire contact surface from a second resin coating layer solidified in the first cavity and the second cavity of the laminate plate by removing the second resin coating layer, respectively; forming each of a first die bonding pad and a second die bonding pad on the first die bonding contact surface and the second die bonding contact surface of the base plate and each of a first wire bonding pad and a second wire bonding pad on the first wire bonding contact surface and the second wire bonding contact surface of the laminate plate using a plate processing, respectively; mounting each of the semiconductor light-emitting chip and the protection device on the first die bonding pad and on the second die bonding pad of the base plate, respectively, and electrically connecting each of top electrodes of the semiconductor light-emitting chip and the protection device to the first wire bonding pad and the second wire bonding pad; and filling the transparent resin in the first cavity and filling the shading resin in the second cavity, and solidifying the transparent and the shading resin using a heating treatment at a second predetermined temperature.

According to another aspect of the disclosed subject matter, a semiconductor light-emitting device can include a metallic laminate substrate having a base plate, at least one laminate plate and a coating layer adhering between the base plate and the laminate plate, and including a laminate body, the base plate including a first base body that is located in a middle portion of the base plate and a first electrode terminal extending from the first body outward, and including a supporting terminal extending from the first base body in an opposite direction of the first electrode terminal, the laminate plate including a second laminate body that is located over the first body via the coating layer and a second electrode terminal extending from the second laminate body in a direction substantially parallel with the first electrode terminal of the base plate along the first electrode terminal, the laminate body of the metallic laminate substrate including the first base body of the base plate and the second laminate body of the laminate plate, and including a first cavity and a second cavity, the first cavity of the laminate body including a first die bonding pad and a first wire bonding pad, and the second cavity of the laminate body including a second die bonding pad and a second wire bonding pad.

In addition, the semiconductor light-emitting device can also include: a semiconductor light-emitting chip mounted in the first cavity, a chip top electrode of the semiconductor light-emitting chip being electrically connected to the first wire bonding pad, and a chip bottom electrode of the semiconductor light-emitting chip being electrically connected to the first die bonding pad; a protection device mounted in the second cavity of the metallic laminate substrate, a device top electrode of the protection device being electrically connected to the second wire bonding pad, and a device bottom electrode of the protection device being electrically connected to the second die bonding pad; a transparent resin encapsulating the semiconductor light-emitting chip in the first cavity of the metallic laminate substrate; and a shading resin encapsulating the protection device in the second cavity of the metallic laminate substrate, wherein the coating layer of the metallic laminate plate covers the laminate body of the metallic laminate plate except the transparent resin and the shading resin.

In the above-described exemplary surface mount device, the coating layer of the metallic laminate plate can includes at least one of a polyamide-imide resin, a polyimide and a polyamide, and also a shape of the first die bonding pad of the first cavity can be formed in a substantially same shape as that of the chip bottom electrode of the semiconductor light-emitting chip. The transparent resin can include at least one wavelength converting material of a red phosphor, a green phosphor, a red phosphor and a yellow phosphor, and the semiconductor light-emitting chip can be mounted on the first die bonding pad in the first cavity using an eutectic bonding of gold-tin. Additionally, the device can also include a pair of openings, which pass through the laminate plate, the coating layer and the base plate of the laminate body of the metallic laminate substrate, and can also include a spacer disposed between the adjacent plates of the metallic laminate substrate.

According to the aspects of the disclosed subject matter, the semiconductor light-emitting devices can include the semiconductor light-emitting chip, which can be mounted on the first die bonding pad formed in a substantially same shape as that of the bottom electrode thereof with a high accuracy using a self-alignment effect in a melting state of the eutectic material of Au—Sn, and which can be attached to a correct position of lighting units using the pair of openings. The semiconductor light-emitting device can include the metallic laminate substrate to efficiently radiate heat generated from the light-emitting chip, and can also include a wavelength converting material in the transparent resin so as to emit various color lights. Therefore, the disclosed subject matter can provide semiconductor light-emitting devices having a high radiating performance and a high alignment accuracy, which can emit various color lights including a substantially white color tone, and therefore can be used as a light source for various lighting units such as a vehicle headlight, general light, a stage lighting, etc.

In addition, the semiconductor light-emitting devices can be manufactured by general forming processes, heating treatment processes, bonding processes and the like in manufacturing processes similar to conventional light-emitting devices. Thus, the disclosed subject matter can provide methods for manufacturing semiconductor light-emitting devices having the high radiating performance and the high alignment accuracy, which can be effectively accomplished using the metallic laminate substrate.

BRIEF DESCRIPTION OF THE DRAWINGS

These and other characteristics and features of the disclosed subject matter will become clear from the following description with reference to the accompanying drawings, wherein:

FIG. 1b is a circuit diagram of the exemplary embodiment of the semiconductor light-emitting device of FIG. 1a;

FIG. 5a to FIG. 5c are cross-section views showing a part of exemplary methods for manufacturing the semiconductor light-emitting device from a preparing process, a first forming process, to a laminate process when a laminate substrate having three layers is used as a laminate body, respectively;

FIG. 8 is a table showing evaluating results of the mechanical tests using the testing sample shown in FIGS. 7a and 7b;

DETAILED DESCRIPTION OF EXEMPLARY EMBODIMENTS

Figure 1A:
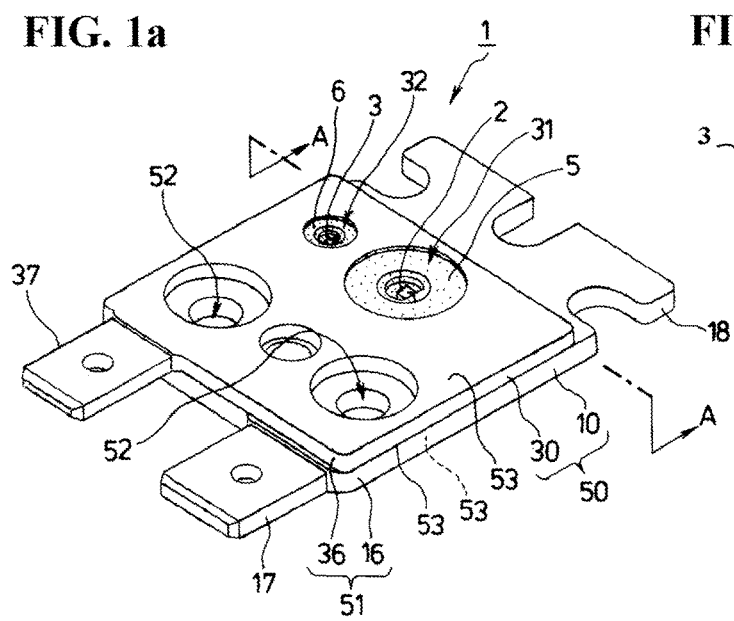
FIG. 1a is a perspective view showing an exemplary embodiment of a semiconductor light-emitting device made in accordance with principles of the disclosed subject matter.
Figure 1B:
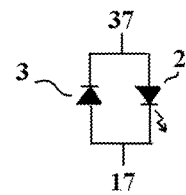

The disclosed subject matter will now be described in detail with reference to FIG. 1 to FIG. 8. FIG. 1 is a perspective view showing an exemplary embodiment of a semiconductor light-emitting device made in accordance with principles of the disclosed subject matter, and FIG. 1b is a circuit diagram of the exemplary embodiment of the semiconductor light-emitting device of FIG. 1a. Here, the semiconductor light-emitting device will now be described in order to facilitate an understanding of manufacturing methods for semiconductor light-emitting devices.

The semiconductor light-emitting device 1 can include a metallic laminate substrate 50 having a base plate 10, a laminate plate 30 and a coating layer 53 adhering between the base plate 10 and the laminate plate 30 as the metallic laminate substrate 50, each of the base plate 10 and the laminate plate 30 made from a metallic plate, the coating layer 53 including a polyamide-imide resin, a polyimide, a polyamide and the like having a high thermal resistance and an insulating performance, the base plate 10 including a first base body 16, which is located in a middle portion thereof, a first electrode terminal 17 extending from the first body 16 outward and a supporting terminal 18 extending from the first base body 16 in an opposite direction of the first electrode terminal 17 of the base plate 10.

The laminate plate 30 also can include a second laminate body 36, which is located over the first body 16 of the base plate 10 via the coating layer 53, and a second electrode terminal 37 extending from the second laminate body 36 in a direction substantially parallel with the first electrode terminal 17 of the base plate 10 along the first electrode terminal 17. Each of the first electrode terminal 17 and the second electrode terminal 37 of the metallic laminate substrate 50 can be used to receive a power supply when the surface mount light-emitting device 1 emit light, and therefore can be electrically connected to a connector for a power supply with confidence by finishing a surface treatment such as a tin-plating treatment.

The metallic laminate substrate 50 can include a laminate body 51 including the first base body 16 and the second laminate body 36, which is adhered by the coating layer 53. The laminate body 51 can include a first cavity 31 and a second cavity 32. The first cavity 31 can include a semiconductor light-emitting chip 2 (e.g., a light-emitting diode (LED) chip) and a transparent resin 5 to encapsulate the semiconductor light-emitting chip 2 therein, and also the second cavity 32 can include a protection device 3 (e.g., a zener diode) and a shading resin 6 to encapsulate the protection device 3. The protection device 3 can protect the semiconductor light-emitting device 2 from a surge as shown in FIG. 1b.

The coating layer 53, which is attached between the base plate 10 and the laminate plate 30, can almost cover the laminate body 51 except the transparent resin 5 disposed in the first cavity 31 and the shading resin 6 disposed in the second cavity 32. Although each of the first electrode terminal 17 and the second electrode terminal 37 is not located on a substantially same extending planar surface in the embodiment, each of the first electrode terminal 17 and the second electrode terminal 37 can be located on a substantially same extending planar surface by bending at least one of the first electrode terminal 17 and the second electrode terminal 37.

In addition, the metallic laminate substrate 50 can include a pair of openings 52, which pass through the laminate plate 30, the coating layer 53 and the base plate 10. When the semiconductor light-emitting device 1 is mounted in lighting units such as a vehicle lamp, each of the openings 52 can align with a mounting position of the lighting units in an accurate fashion. Accordingly, the lighting units using the semiconductor light-emitting device 1 can perform original optical characteristics thereof because a positional accuracy between the semiconductor light-emitting device 1 and the mounting position can improve.

Figure 2:
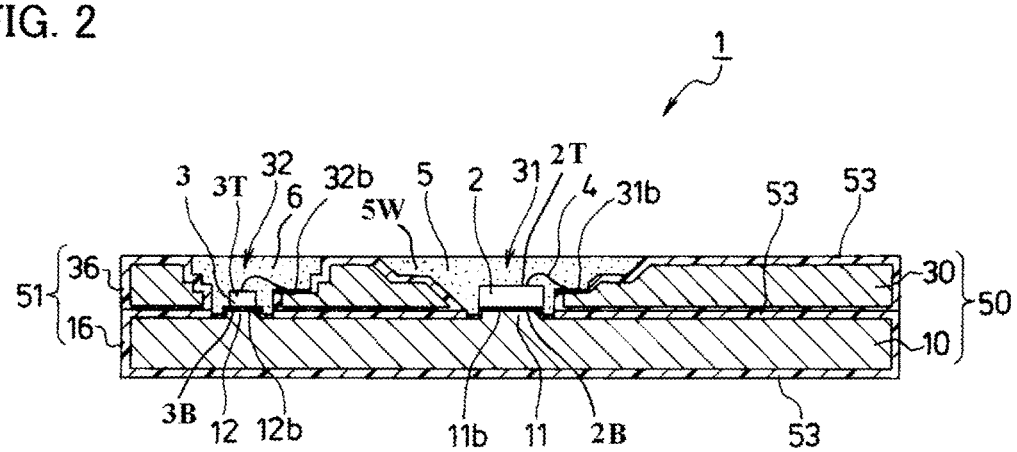
FIG. 2 is a cross-sectional side view taken along Line A-A show in FIG. 1 of the semiconductor light-emitting device made in accordance with the exemplary embodiment of FIG. 1.

More detail will now be describe with reference to FIG. 2, which is a cross-sectional side view taken along Line A-A show in FIG. 1 of the semiconductor light-emitting device made in accordance with the exemplary embodiment of FIG. 1. Each of the first cavity 31 and the second cavity having a bottom surface, which is a top surface of the base plate 10, and therefore each of depths of the first cavity 31 and the second cavity 32 can basically be a thickness of the laminate plate 30.

However, each of the bottom surfaces of the first cavity 21 and the second cavity 32 can include a first seat 11 and a second seat 12, respectively. Each of shapes of top surfaces of the first seat 11 and the second seat 12 can be a substantially same shape as a contact shape of the semiconductor light-emitting chip mounted on the first seat 11 and also as a contact shape of the protection device 3 mounted on the second seat 11, respectively. Each of the first seat 11 and the second seat 12 can include a first die bonding pad 11b and a second die bonding pad 12b each, on which a plate processing is finished by a metallic material having a high solderability to be electrically and mechanically connected to the semiconductor light-emitting chip 2 and the protection device 3 with confidence, respectively.

In addition, each of the first cavity 31 and the second cavity 32 can include a first wire bonding pad 31b and a second wire bonding pad 32b on an inner surface thereof, respectively. On each of the first wire bonding pad 31b and the second wire bonding pad 32b, a plate processing can be finished by a metallic material having a high solderability to be electrically and mechanically connected to each of top electrodes 2T and 3T of the semiconductor light-emitting chip 2 and the protection device 3 via a bonding wire 4, respectively.

The semiconductor light-emitting chip 2 can be mounted on the first die bonding pad 11b in the first cavity 31 using an eutectic bonding of gold-tin (Au—Sn), and also the protection device 3 can be mounted on the second die bonding pad 12b in the second cavity 32 using the eutectic bonding of Au—Sn. Thereby, the semiconductor light-emitting chip 2 having a chip bottom electrode 2B can be electrically and mechanically connected to the first die bonding pad 11b, and the chip top electrode 2T thereof can also be connected to the first wire bonding pad 31b via a first bonding wire 4 with confidence.

Similarly, the protection device 3 having a device bottom electrode 3B can also be electrically and mechanically connected to the second die bonding pad 12b, and the device top electrode 3T thereof can be connected to the second wire bonding pad 32b via a second bonding wire with confidence. The shading resin 6 can encapsulate the protection device 3 including the second bonding wire in the second cavity 32 to protect from an external environment such as dust, moisture, etc. The transparent resin 5 can also encapsulate the semiconductor light-emitting chip 2 including the first bonding wire in the second cavity 32 to protect from an external environment as described above.

As the semiconductor light-emitting chip 2, the LED chip, a laser diode and the like can be used. When the semiconductor light-emitting chip 2 is a blue LED emitting blue light, YAG phosphor ($Y_3Al_5O_{12}:Ce^{3+}$), SiAlON phosphor, an orthosilicate phosphor and like can be used as a wavelength converting material 5W, which is dispersed in the transparent resin 5 so that the semiconductor light-emitting device 1 can emit light having a substantially white color tone.

When the semiconductor light-emitting chip 4 is a blue LED chip having a peak wavelength of approximately 450 nanometers and the transparent resin 5 includes the wavelength converting material 5W, the wavelength converting material 5W can convert light emitted from the semiconductor light-emitting chip 2 into a particular wavelength or range of wavelengths of light by being excited using the light emitted from the semiconductor light-emitting chip 2. Accordingly, the semiconductor light-emitting device 1 can emit light having a different wavelength from that of the semiconductor light-emitting chip 2 by an additive color mixture of a part of the light emitted from the semiconductor light-emitting chip 2 and the wavelength converted light excited by another part of the light.

The transparent resin 5 including the wavelength converting material 5W can be made by mixing a yellow phosphor such as YAG phosphor, SiAlON phosphor, an orthosilicate phosphor and like with a transparent resin such as a silicone resin, an epoxy resin and the like. Organic solvents such as an alcohol and the like can be used in place of the transparent resin 5. When the semiconductor light-emitting chip 2 is the blue LED chip having the peak wavelength of 450 nanometers, the yellow phosphor can emit a yellow light upon being excited by blue light emitted from the blue LED chip. The semiconductor light-emitting device 1 can emit substantially white light that can be used as a light source for a headlight and the like, by an additive color mixture of the excited yellow light emitted from the yellow phosphor and a part of the blue light emitted from the blue LED chip.

In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device 1 can emit light having a substantially white color tone by an additive color mixture of the red-purple light emitted from the red phosphor that is excited by the blue light, the blue-green light emitted from the green phosphor that is excited by the blue light and a part of the blue light. The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6(O, N)$: $Eu^{2+}$ and the like can be used as the green phosphor.

In addition, when the semiconductor light-emitting chip 2 is an LED, which emits ultraviolet light, the transparent resin 5 can include at least one of the red phosphor, the green phosphor and a blue phosphor such as $(Sr, Ca, Ba, Mg)_{10}(PO_4)_6C_{12}$: $Eu^{2+}$, $BaMgAl_{10}O_{17}$: $Eu^{2+}$, $LaAl(Si, Al)_6(N, O)_{10}$: $Ce^{3+}$, etc. as the wavelength converting material. In this case, the semiconductor light-emitting device 1 can various color light including substantially white color light based upon an additive color mixture of light's three primary colors of red-green-blue by adjusting each ratio of amounts of the red phosphor, the green phosphor and the blue phosphor.

Exemplary methods for manufacturing the semiconductor light-emitting device will now be described with reference to FIG. 3a to FIG. 3h.

Figure 3A:
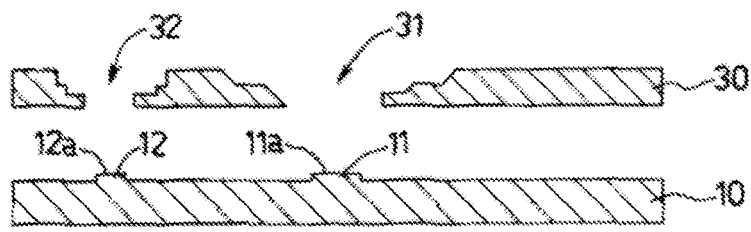
FIG. 3(a) to FIG. 3(h) are cross-section views showing exemplary methods for manufacturing the semiconductor light-emitting device from a preparing process, a first forming process, a second forming process, a fourth forming process, an exposing process, a fifth forming process, a chip mounting process, to an encapsulating process, respectively.

Process (a) is preparing the base plate 10 including a first die bonding contact surface 11a formed on the first seat 11 and a second die bonding contact surface 12a formed on the second seat 12, and is preparing the laminate plate 30 including the first cavity 31 and the second cavity 32 as shown in FIG. 3a.

Figure 3B:
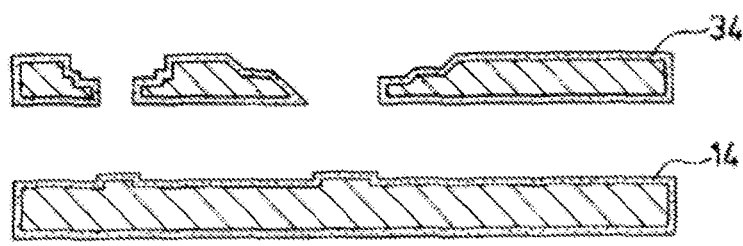

Process (b) is forming a first coating layer 14 around the base plate 10 using an electro-painting method, and is forming a second coating layer 34 around the laminate plate 30 using the electro-painting method, as shown in FIG. 3b.

Figure 3C:
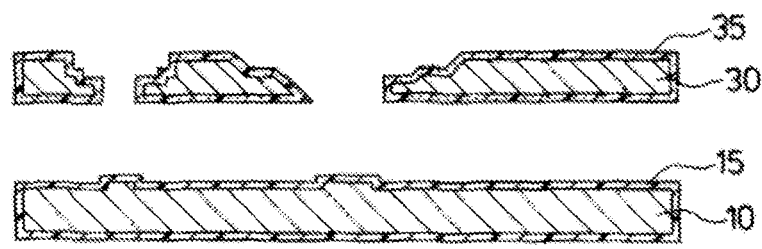

Process (c) is forming a first resin coating layer 15 around the base plate 10 by solidifying the base plate 10 including the first coating layer 14 made in Process (b) using a heating treatment at a first prescribed temperature, and is forming a soft second resin coating layer 35 around the laminate plate 30 by semi-solidifying the laminate plate 30 including the second coating layer 34 made in Process (b) using a heating treatment at a first predetermined temperature as shown in FIG. 3c.

Figure 3D:
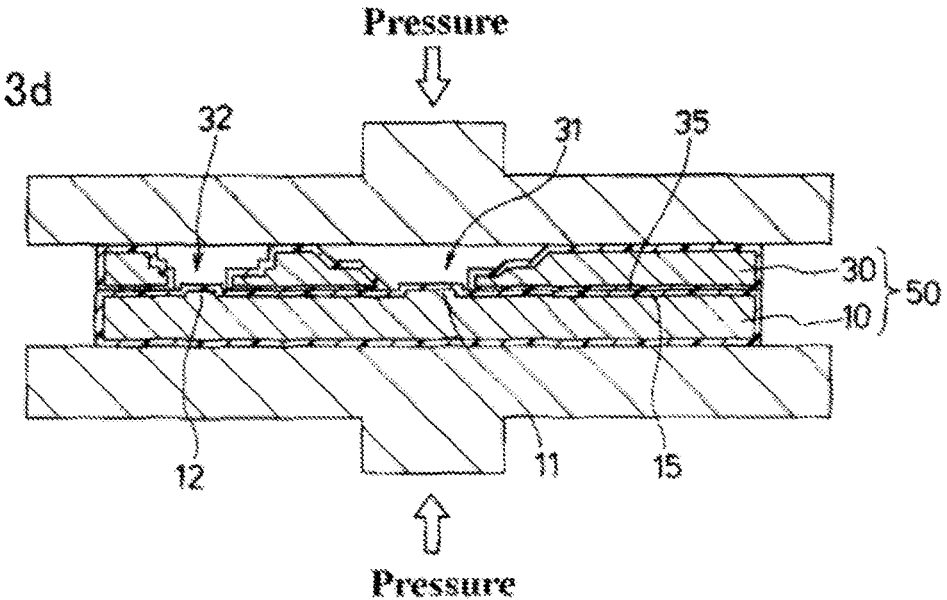

Process (d) is forming the metallic laminate substrate 50, which is completely solidified by overlapping the laminate plate 30 with the base plate 10 in a predetermined position and by pressuring the laminate plate 30 and the base plate 10 from both sides of the laminate plate 30 including the soft second resin coating layer 35 and the base plate 10 while carrying out a heating treatment at a second prescribed temperature as shown in FIG. 3d.

Figure 3E:
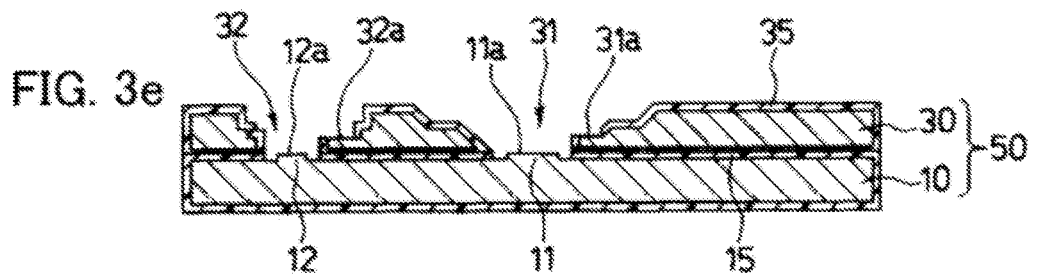

Process (e) is exposing the first die bonding contact surface 11a and the second die bonding contact surface 12a from the first resin coating layer 15 by removing the first resin coating layer 15 of the base plate 10 using a laser beam and the like, and is exposing each of a first bonding wire contact surface 31a and a second bonding wire contact surface 32a from a second resin coating layer 35 solidified in the first cavity 31 and the second cavity 32 of the laminate plate 30 by removing the second resin coating layer 35 using the laser beam and the like, respectively, as shown in FIG. 3e.

Figure 3F:
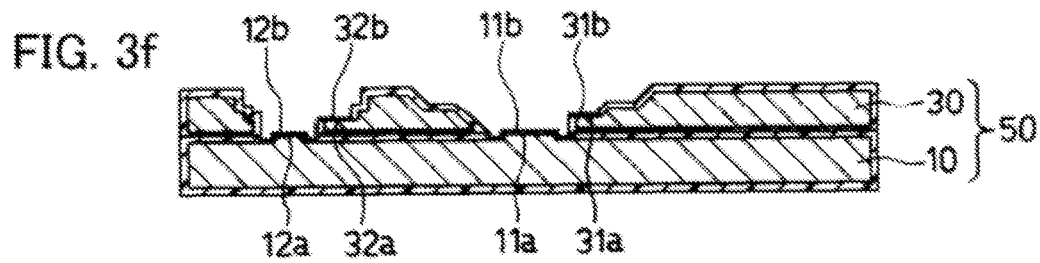

Process (f) is forming each of the first die bonding pad 11b and the second die bonding pad 12b on the first die bonding contact surface 11a and the second die bonding contact surface 12a of the base plate 10 and each of the first wire bonding pad 31b and the second wire bonding pad 32b on the first wire bonding contact surface 31a and the second wire bonding contact surface 32a of the laminate plate 30 using a plate processing, respectively, as shown in FIG. 3f.

Figure 3G:
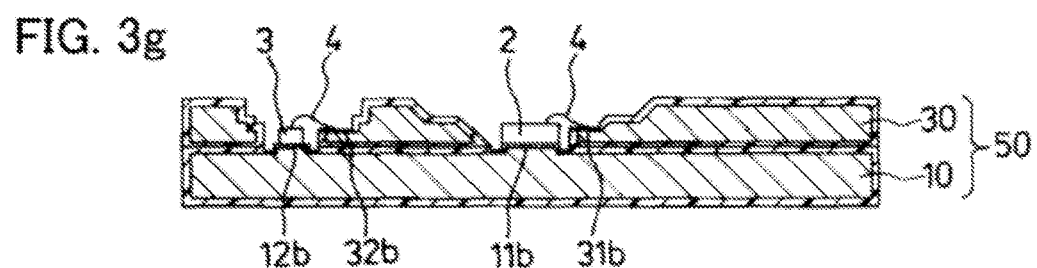
Figure 3H:
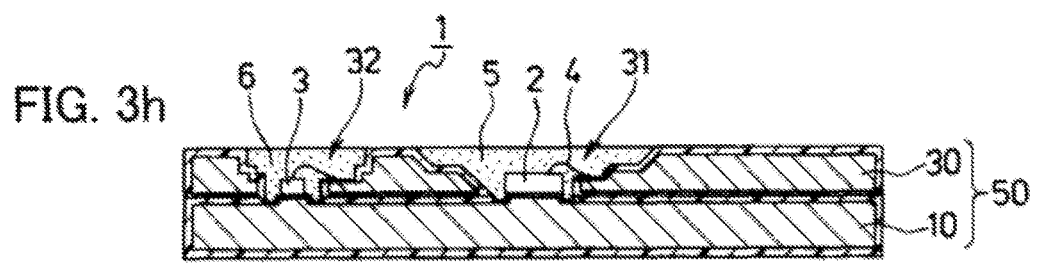

Process (g) is mounting each of the semiconductor light-emitting chip 2 and the protection device 3 on the first die bonding pad 11b and on the second die bonding pad 12b of the base plate 10 using the eutectic bonding of Au—Sn, respectively, and is electrically connecting each of the top electrodes 2T and 3T of the semiconductor light-emitting chip 2 and the protection device 3 to the first wire bonding pad 31b and the second wire bonding pad 32b via the wire bonding 4, respectively, as shown in FIG. 3g.

Thereby, each of the bottom electrodes 2B and 3B of the semiconductor light-emitting chip 2 and the protection device 3 can be electrically connected to the first die bonding pad 11b and the second die bonding pad 12b of the base plate 10, respectively. In this case, because each of the shapes of the first die bonding pad 11b and on the second die bonding pad 12b of the base plate 10 is the substantially same shape as each of the contact shapes of the semiconductor light-emitting chip 2 and the protection device 3, respectively, each of the semiconductor light-emitting chip 2 and the protection device 3 can be mounted on the first die bonding pad 11b and the second die bonding pad 12b of the base plate 10 with a high accuracy using a self-alignment effect in a melting state of the eutectic material of Au—Sn, respectively.

Process (h) is filling the transparent resin 5 in the first cavity 31 and the shading resin 6 in the second cavity 32, and is solidifying the transparent 5 and the shading resin 6 using a heating treatment at a second predetermined temperature. Accordingly, the semiconductor light-emitting device 1 can be finished after encapsulating each of the semiconductor light-emitting chip 2 in the first cavity 31 and the protection device 3 in the second cavity 32 with the transparent resin 5 and the shading resin 6, respectively.

Figure 4:
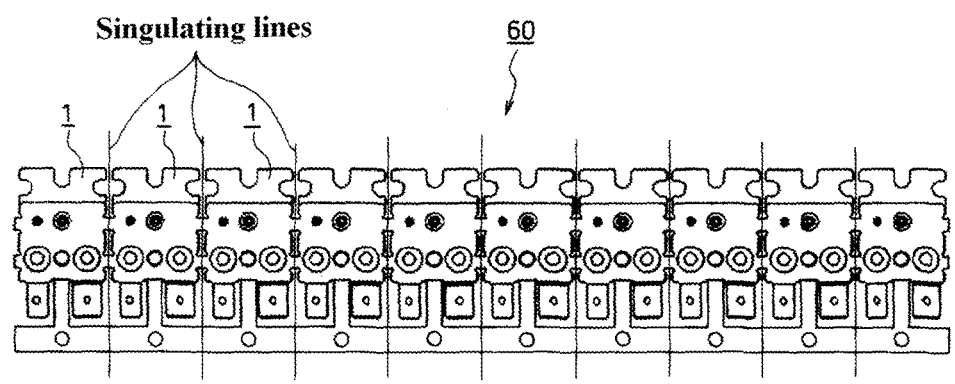
FIG. 4 is a partial top view showing an exemplary singulating process in methods for manufacturing the semiconductor light-emitting device on a large scale.

When the semiconductor light-emitting device 1 is produced on a large scale at once, multiply connecting semiconductor light-emitting devices are manufactured in accordance with the above-described processes and many of the semiconductor light-emitting devices 1 can be produced by singulating the multiply connecting semiconductor devices after Process (h) at once, as shown in FIG. 4.

The above-described embodiment including the metallic laminate substrate 50 having the base plate 10 and the laminate plate 30 is described. However, for example, a laminate substrate having three plates can be used as the metallic laminate substrate 50.

Process (A) is preparing a second base plate 61, a first laminate plate 64 and a second laminate plate 67, and is forming each of a second base coating layer 62, a first laminate coating layer 65 and a second laminate coating layer 68 around the second base plate 61, the first laminate plate 64 and the second laminate plate 67, respectively, as shown in FIG. 5a.

Process (B) is form a second base resin coating layer 63 around the second base plate 61 and a second laminate resin coating layer 69 around the second laminate plate 67 by solidifying the second base plate 61 including the second base coating layer 62 and the second laminate plate 67 including the second laminate coating layer 68 made in Process (A) using a heating treatment at a prescribed temperature, and is forming a first soft resin coating layer 66 around the first laminate plate 64 by semi-solidifying the first laminate plate 64 including the first laminate coating layer 65 made in Process (A) using a heating treatment at a predetermined temperature as shown in FIG. 5b.

Process (C) is forming the second metallic laminate substrate 70, which is completely solidified by overlapping the first laminate plate 64 and the second laminate plate 67 with the second base plate 61 in a predetermined position and by pressuring the second metallic laminate 70 from both sides of the second laminate plate 67 including the second laminate resin coating layer 69 and the second base plate 61 including the second base resin coating layer 63 while carrying out a heating treatment at a prescribed temperature as shown in FIG. 5c.

Figure 6A:
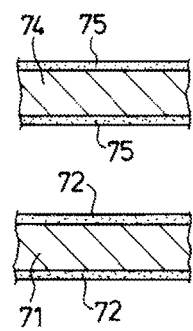
FIG. 6a to FIG. 6c are cross-section views showing a part of exemplary methods for manufacturing the semiconductor light-emitting device including a spacer from a preparing process, a first forming process, to a laminate process, respectively.
Figure 6B:
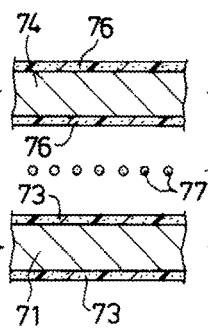

In the structures described above of the disclosed subject matter, a space between the above-described adjacent plates can maintain a substantially same thickness by disposing a spacer between the above-described adjacent plates. As shown in FIG. 6a, each of a third coating layer 72 and a third laminate coating layer 75 can be applied around a third base plate 71 and a third laminate plate 74 in forming process, respectively. while a soft third resin coating layer 73 is formed around the third base plate 71, a soft third laminate resin coating layer 76 can be formed around the third laminate plate 74 by heating the third base plate 71 including the third coating layer 72 and the third laminate plate 74 including the third laminate coating layer 75 as shown in FIG. 6b.

Figure 6C:
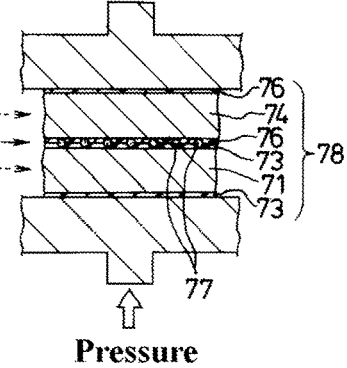

A third metallic laminate substrate 78 including a spacer 77 can be completely solidified by overlapping the third laminate plate 74 with the third base plate 71 in a predetermined position while the spacer 77 having a substantially same diameter is disposed between the third laminate plate 74 with the third base plate 71 at a predetermined interval, and by pressuring the third laminate plate 74 and the third base plate 71 from both sides of the third laminate plate 74 and the third base plate 71 while carrying out a heating treatment at a prescribed temperature as shown in FIG. 6c.

In this case, the third laminate substrate 78 having two layers can be finished by adhering the soft third resin coating layer 73 located on the third base plate 71 and the soft third laminate coating layer 76 located underneath the third laminate plate 74 with respect to each other, in which the spacer maintains a substantially same thickness between the third base plate 71 and the third laminate plate 74. Accordingly, the third laminate substrate 78 can be employed as a laminate substrate having multi-layers as so to be able to maintain a desirable space between the adjacent layers even when the third laminate substrate 78 is formed in a large size.

In these cases, a floating capacitance Ct between the base plate and the laminate plate may connect a contact capacitance Cs of the semiconductor light-emitting chip 2 in parallel. When a static electricity of V voltages applies between the base plate and the laminate plate, a voltage Vesd applied between the electrodes of the semiconductor light-emitting chip 2 is as follows.

$$Vesd = ((Cs/(Cs+Ct))*V \quad \text{(Formula 1)}$$

When a thickness between the base plate and the laminate plate is 20 micro meters and an adhesive area is 625;square millimeters, Ct may be approximately 1000 picofarad and Cs is approximately 150 picofarads, V esd is 0.13 voltages. That is to say, the voltage Vesd applied between the electrodes of the semiconductor light-emitting chip 2 may decrease at a one-eighth.

Accordingly, the above-described structure of the disclosed subject matter can decrease the voltage Vesd applied between the electrodes of the semiconductor light-emitting chip 2, and therefore can prevent the semiconductor light-emitting chip 2 from a breakdown due to a high static electricity.

Figure 7A:
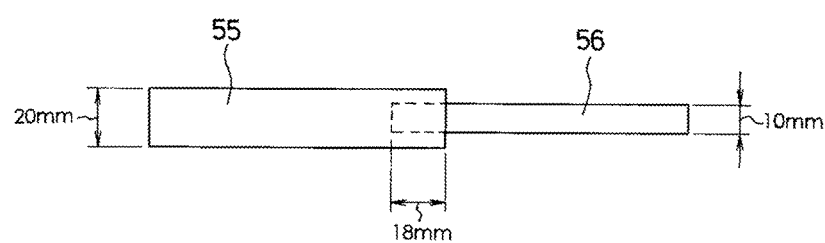
FIGS. 7a and 7b are a top view and a side view showing an exemplary testing sample for mechanical tests, respectively.
Figure 7B:
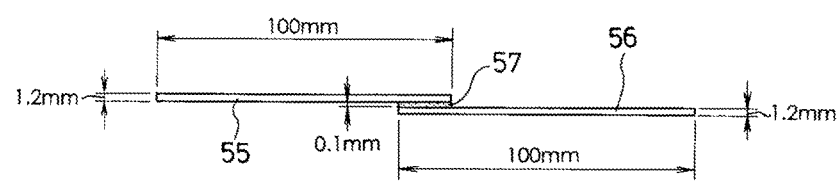
Figure 9:
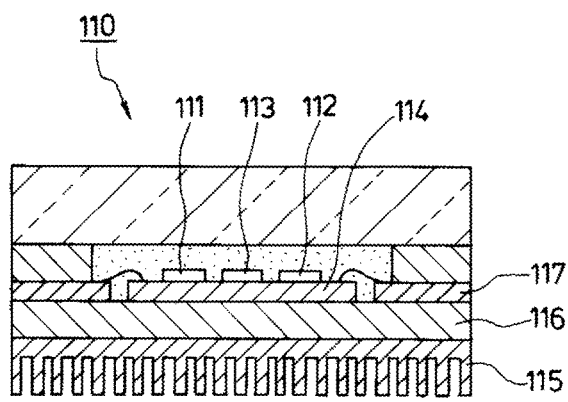
FIG. 9 is an explanatory cross-sectional view depicting a first conventional semiconductor light-emitting device.
Figure 10:
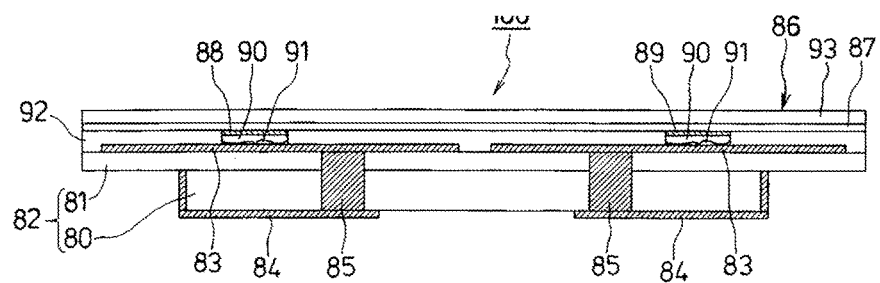
FIG. 10 is an explanatory cross-sectional view depicting a second conventional semiconductor light-emitting device.

Evaluating results of mechanical tests will now be described with reference to FIG. 7a to FIG. 8. FIGS. 7a and 7b are a top view and a side view showing an exemplary testing sample. The testing sample includes a first metallic plate 55 having a thickness of 1.2 millimeters, a width of 20 millimeters and a length of 100 millimeters, and a second metallic plate 56 having a thickness of 1.2 millimeters, a width of 10 millimeters and a length of 100 millimeters. The first metallic plate 55 includes the coating layer of polyamide formed by the electro-painting method and solidified by the heating treatment around thereof. The second metallic plate 56 includes the coating layer of polyamide formed by the electro-painting method and semi-solidified by the heating treatment around thereof.

The testing sample is made by pressuring the first metallic plate 55 and the second metallic plate 56 from both sides of the first metallic plate 55 and the second metallic plate 56 while carrying out a heating treatment at a prescribed temperature after the first metallic plate 55 is overlapped with the second metallic plate 56 in a position of the coating layer 57 having a length of 18 millimeters and a thickness of 0.1 millimeters, and by completely solidifying the plates 55 and 56.

A heat shock test of three testing samples is carried out by 500, 1000, 2000 and 3000 cycles, in which one cycle for 30 minutes is staying at −40 centigrade temperature for 15 minutes and is staying at 165 centigrade temperature for 15 minutes. A testing method is based upon JIS K6850, and a testing speed is 0.3 millimeters/minute. As shown in FIG. 8, tension strength maintains at approximately 90 kgf (45 percentages with respect to initial value) and a shear strength maintains at 4.8 MPa (45 percentages with respect to initial value). Accordingly, the coating layer of polyamide formed by the electro-painting method can verify a conclusion of strong mechanical strengths in the structure of the disclosed subject matter.

As described above, the semiconductor light-emitting device 1 can include the semiconductor light-emitting chip 2 mounted on the first die bonding pad 11b with a high accuracy using a self-alignment effect in a melting state of the eutectic material of Au—Sn, because the first die bonding pad 11b is formed in a substantially same shape as that of the bottom electrode 2b of the semiconductor light-emitting chip 2. The semiconductor light-emitting device 1 can be attached to a correct position of lighting units using the pair of openings 52 when the semiconductor light-emitting device is used as a light source for the lighting units In addition, the semiconductor light-emitting device can include the metallic laminate substrate 50 including the base plate 10 and the laminate plate 30, which are made by a metallic plate having a thermal conductivity to efficiently radiate heat generated from the semiconductor light-emitting chip 2, and can also include a wavelength converting material 5W in the transparent resin 5 so as to be able to emit various color lights including a white color tone.

Therefore, the disclosed subject matter can provide semiconductor light-emitting devices having a high radiating performance and a high alignment accuracy, which can emit various color lights including a substantially white color tone, and which can be used as a light source for various lighting units such as a vehicle headlight, general light, a stage lighting, etc.

Moreover, the semiconductor light-emitting devices can be manufactured by general forming processes, heating treatment processes, bonding processes and the like in manufacturing processes similar to conventional light-emitting devices. Many of the semiconductor light-emitting devices 1 can be produced by singulating the multiply connecting semiconductor devices at once, as shown in FIG. 4. Thus, the disclosed subject matter can provide methods for manufacturing the semiconductor light-emitting devices having the high radiating performance and the high alignment accuracy, which can be effectively accomplished by using the metallic laminate substrate.

Furthermore, the semiconductor light-emitting devices can also emit various colored lights by combining the above-described laser chip with the wavelength converting board 54W including at least one phosphor, and therefore can also be used as a light source device for various applications such as general lighting, a street light, stage lighting, traffic lights and the like using a small and simple optical member. In addition, it is conceived that each of the different aspects and features of the different embodiments disclosed herein could be used interchangeably in and with the other disclosed embodiments. For example, it is contemplated that any different color chip or different wavelength material can be used in any of the disclosed embodiments and in any combination.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entireties by reference.

What is claimed is:

1. A method for manufacturing semiconductor light-emitting devices comprising:
    preparing a base plate including a first die bonding contact surface and a second die bonding contact surface, and preparing a laminate plate including a first cavity and a second cavity;
    forming a first coating layer around the base plate using an electro-painting method, and forming a second coating layer around the laminate plate using the electro-painting method;
    forming a first resin coating layer around the base plate by solidifying the base plate including the above-described first coating layer using a heating treatment at a first prescribed temperature, and forming a soft second coating layer around the laminate plate by semi-solidifying the laminate plate including the above-described second coating layer using a heating treatment at a first predetermined temperature;
    forming the metallic laminate substrate, which is completely solidified by overlapping the laminate plate including the soft second coating layer with the base plate in a predetermined position and by pressuring the laminate plate including the soft second coating layer and the base plate from both sides of the laminate plate and the base plate, while carrying out a heating treatment at a second prescribed temperature;
    removing the first resin coating layer on the first die bonding contact surface and the second die bonding contact surface of the base plate, and exposing each of a first bonding wire contact surface and a second bonding wire contact surface from a second resin coating layer solidified in the first cavity and the second cavity of the laminate plate by removing the second resin coating layer, respectively;
    forming each of a first die bonding pad and a second die bonding pad on the first die bonding contact surface and the second die bonding contact surface of the base plate and each of a first wire bonding pad and a second wire bonding pad on the first wire bonding contact surface and the second wire bonding contact surface of the laminate plate using a plate processing, respectively; and
    mounting each of a semiconductor light-emitting chip and a protection device on the first die bonding pad and on the second die bonding pad of the base plate, respectively, and electrically connecting each of top electrodes of the semiconductor light-emitting chip and the protection device to the first wire bonding pad and the second wire bonding pad; and
    filling a transparent resin in the first cavity and filling a shading resin in the second cavity, and solidifying the transparent resin and the shading resin using a heating treatment at a second predetermined temperature.

2. The method for manufacturing semiconductor light-emitting devices according to claim 1, wherein each of the first resin coating layer of the base plate and the second resin coating layer of the metallic laminate plate includes at least one of a polyamide-imide resin, a polyimide and a polyamide.

3. The method for manufacturing semiconductor light-emitting devices according to claim 1, wherein the semiconductor light-emitting chip is mounted on the first die bonding pad in the first cavity using an eutectic bonding of gold-tin (Au—Sn).

4. The method for manufacturing semiconductor light-emitting devices according to claim 1, wherein the first die bonding pad of the first cavity of the metallic laminate substrate is formed in a substantially same shape as that of the chip bottom electrode of the semiconductor light-emitting chip.

5. The method for manufacturing semiconductor light-emitting devices according to claim 1, wherein each of the base plate and the metallic laminate substrate is also used as an electrode terminal for receiving a power supply, respectively.

6. The method for manufacturing semiconductor light-emitting devices according to claim 1, further comprising:
    a pair of openings passing through the laminate plate, the first resin coating layer, the second resin coating layer and the base plate of the metallic laminate substrate.

7. A method for manufacturing semiconductor light-emitting devices comprising:
    preparing a base plate including at least one die bonding contact surface and forming a first coating layer around the base plate using an electro-painting method, and preparing a laminate plate including at least one cavity and forming a second coating layer around the laminate plate using the electro-painting method;
    solidifying a first resin coating layer around the base plate using a heating treatment at a first prescribed temperature, and semi-solidifying a soft second coating layer around the laminate plate using a heating treatment at a first predetermined temperature;
    forming a metallic laminate substrate by overlapping the base plate including a solidified first resin coating layer with the laminate plate including said semi-solidified soft second coating layer in a predetermined position and by press-heating the laminate plate including the semi-solidified second coating layer and the base plate including the solidified first resin coating layer at a second prescribed temperature;
    removing the first resin coating layer on the at least one die bonding contact surface of the base plate, and exposing at least one bonding wire contact surface from a second resin coating layer solidified in the at least one cavity of the laminate plate by removing the second resin coating layer;
    forming at least one die bonding pad on the at least one die bonding contact surface of the base plate and at least one wire bonding pad on the at least one wire bonding contact surface of the laminate plate using a plate processing;

mounting at least one semiconductor light-emitting chip on the at least one die bonding pad and electrically connecting a top electrode of the at least one semiconductor light-emitting chip to the at least one wire bonding pad; and filling a transparent resin in the at least one cavity, and solidifying the transparent resin using a heating treatment at a second predetermined temperature.

8. The method for manufacturing semiconductor light-emitting devices according to claim 7, wherein each of the first resin coating layer of the base plate and the second resin coating layer of the metallic laminate plate includes at least one of a polyamide-imide resin, a polyimide and a polyamide.

9. The method for manufacturing semiconductor light-emitting devices according to claim 7, wherein the semiconductor light-emitting chip is mounted on the at least one die bonding pad in the at least one cavity using an eutectic bonding of gold-tin (Au—Sn).

10. The method for manufacturing semiconductor light-emitting devices according to claim 7, wherein each of the base plate and the metallic laminate substrate is also used as an electrode terminal for receiving a power supply, respectively.

11. The method for manufacturing semiconductor light-emitting devices according to claim 7, further comprising:
a pair of openings passing through the laminate plate, the first resin coating layer, the second resin coating layer and the base plate of the metallic laminate substrate.

12. The method for manufacturing semiconductor light-emitting devices according to claim 7, wherein the at least one die bonding pad of the at least one cavity of the metallic laminate substrate is formed in a substantially same shape as that of the chip bottom electrode of the semiconductor light-emitting chip.

* * * * *